United States Patent [19]

Hayashi et al.

[11] Patent Number: 5,382,925
[45] Date of Patent: Jan. 17, 1995

[54] HYBRID COUPLER

[75] Inventors: Katuhiko Hayashi, Chiba; Hiroshi Ikeda, Tokyo; Akira Aotani, Chiba, all of Japan

[73] Assignee: TDK Corporation, Tokyo, Japan

[21] Appl. No.: 117,139

[22] PCT Filed: Mar. 18, 1993

[86] PCT No.: PCT JP93/00321
§ 371 Date: Sep. 9, 1993
§ 102(e) Date: Sep. 9, 1993

[87] PCT Pub. No.: WO93/19527
PCT Pub. Date: Sep. 30, 1993

[30] Foreign Application Priority Data

Mar. 19, 1992 [JP] Japan .................. 4-063015
Nov. 26, 1992 [JP] Japan .................. 4-317056
Nov. 27, 1992 [JP] Japan .................. 4-318092
Dec. 18, 1992 [JP] Japan .................. 4-338452

[51] Int. Cl.$^6$ .......................................... H01P 5/16
[52] U.S. Cl. ........................... 333/112; 333/116; 333/118
[58] Field of Search .......... 333/109, 112, 116-118, 333/238, 246

[56] References Cited

U.S. PATENT DOCUMENTS 4,482,873 11/1984 Nyhus ............................ 333/116
4,758,922 7/1988 Ishigaki et al. ................. 333/246 X

FOREIGN PATENT DOCUMENTS 60-51253 11/1985 Japan .
62-47222  3/1987 Japan .
2-210906  8/1990 Japan .

*Primary Examiner*—Paul Gensler
*Attorney, Agent, or Firm*—Collard & Roe

[57] ABSTRACT

A plurality of inductors and a plurality of capacitors are formed as conductor patterns (3-1 to 3-4, 4-1 to 4-8, 5) on dielectric layers (1-1 to 1-6) constituting a multi-layer wiring board. A set of circuit elements (inductors and capacitors) required to have the same inductance or capacitance value are formed on the common layers of the multi-layer wiring board. Thus, the circuit elements required to have the same value in the multi-layer wiring board can be manufactured under the same condition (the baking condition for example), so that the variations of the elements can be reduced.

11 Claims, 10 Drawing Sheets (C2=C21+C22, C5=C51+C52)

(C2=C21+C22, C5=C51+C52)

L11=L12<L13=L14

C11=C13=C12=C14

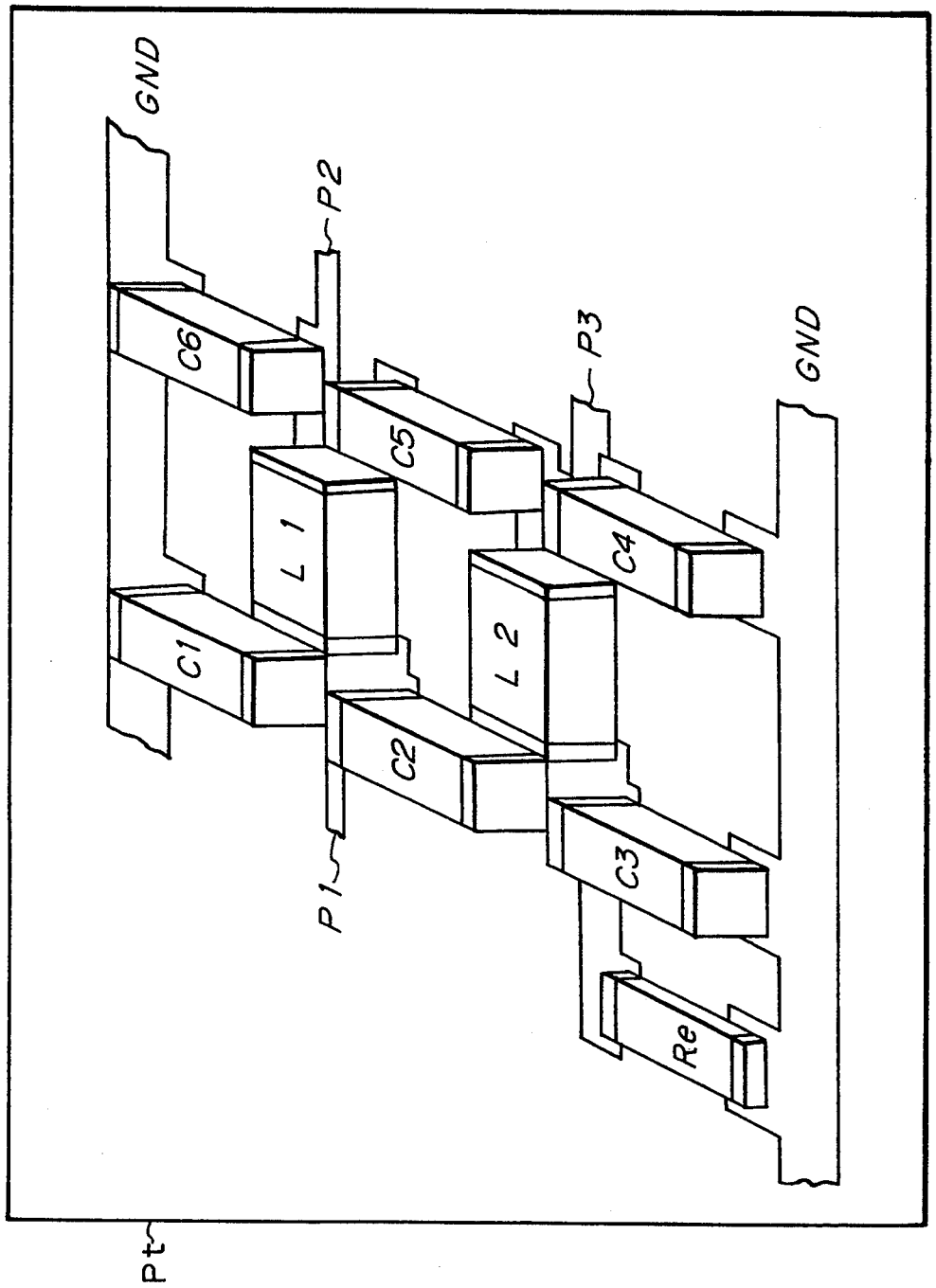
Fig. 12 - Prior Art

Fig. 13 - Prior Art
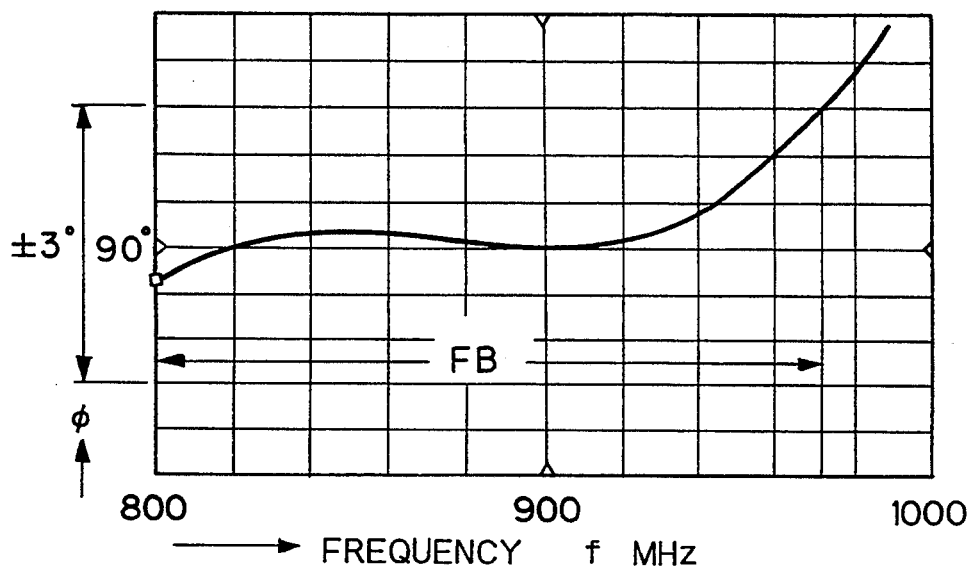
Fig. 14 - Prior Art
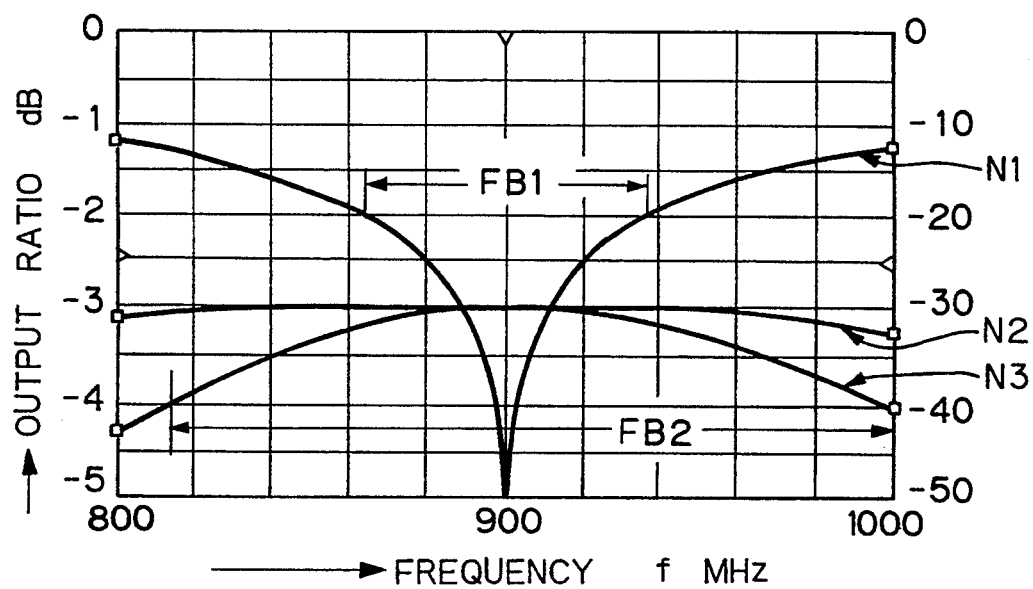

Fig. 15 - Prior Art
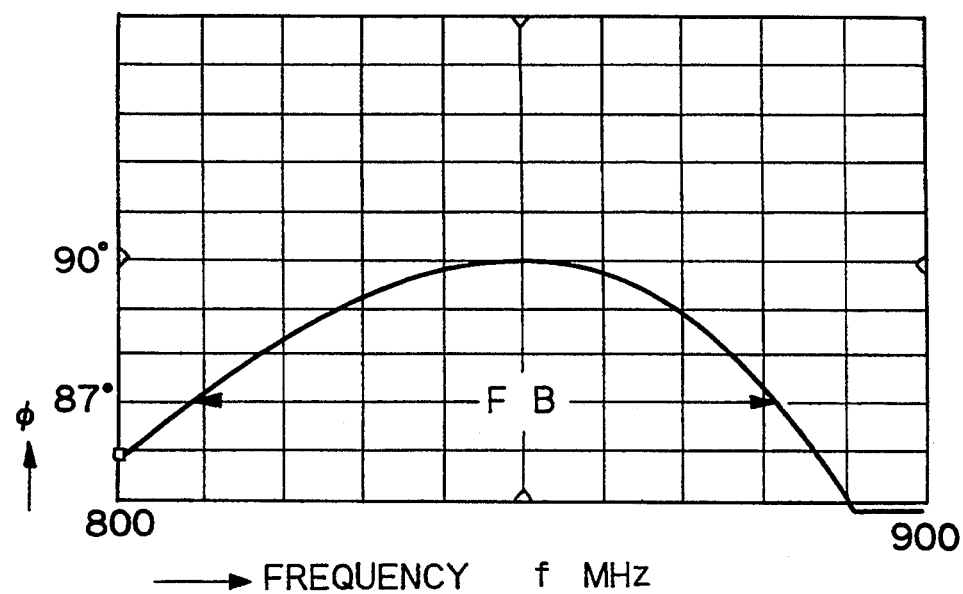
Fig. 16 - Prior Art
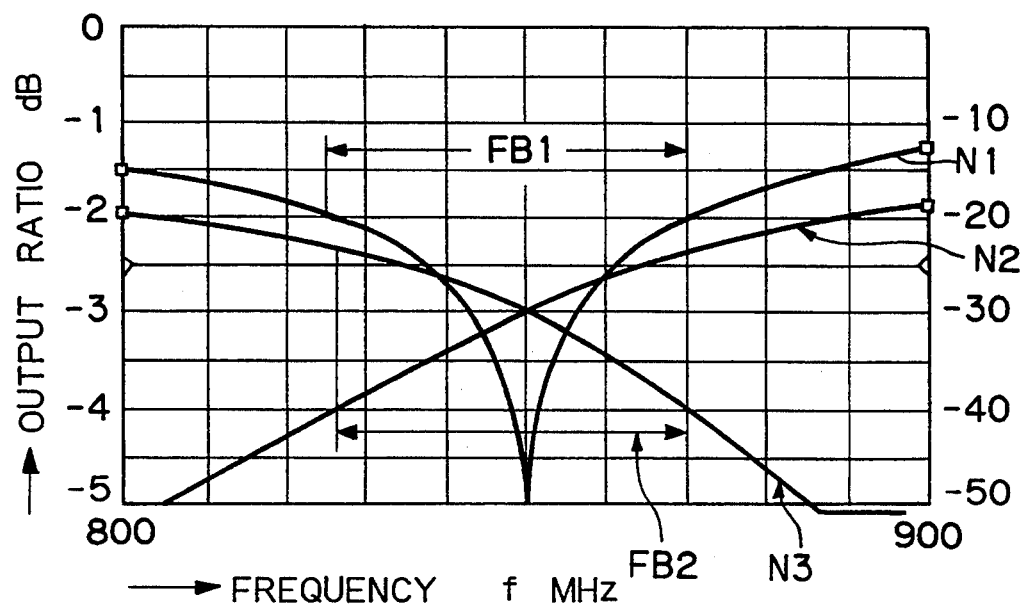

HYBRID COUPLER

FIELD OF THE INVENTION

The present invention relates to a hybrid coupler for use as a phase shifter, a power divider or a power combiner in radio equipment such as the cordless phone or the portable phone, or in other various types of communication equipment.

BACKGROUND OF THE INVENTION

Heretofore, in various types of radio equipment or in other communication equipment, couplers using hybrid circuits (hereafter referred as "hybrid coupler") have been used.

A hybrid coupler is a circuit having three or more ports (input/output terminals) and used as a power divider or combiner, or as a phase shifter. The conventional hybrid coupler will be described with reference to the accompanying drawings.

FIGS. 9 to 16 are diagrams used for explaining the prior art. In which, FIG. 9 shows the block constitution of a typical hybrid coupler, FIG. 10 shows a circuit example of a typical capacitive coupling type hybrid coupler, FIG. 11 shows a circuit example of a typical inductive coupling type hybrid coupler, FIG. 12 shows an example of the prior-art hybrid coupler practically mounted on a wiring board, FIG. 13 shows phase shift characteristics of the prior-art inductive coupling type hybrid coupler, FIG. 14 shows band pass characteristics the prior-art inductive coupling type hybrid coupler, FIG. 15 shows phase shift characteristics of the prior-art capacitive coupling type hybrid coupler, and FIG. 16 shows band pass characteristics of the prior-art capacitive coupling type hybrid coupler.

In these FIGS. 9 to 16, C1 to C6 and C11 to C14 denote capacitors, L1, L2 and L11 to L14 denote inductors, P1 to P3 denote ports (input/output terminals), HY denotes a hybrid circuit, Re denotes a resistor, and Pt denotes a wiring board (printed wiring board).

As shown in FIG. 9, the typical hybrid coupler is formed by a hybrid circuit HY with three ports P1 to P3 and a resistor Re connected to its terminal not used as a port. In the hybrid coupler of this figure, when a signal is applied to the port P1, this signal will appear both at the port P2 and the port (when the coupler is used as a power divider). When a signal is applied to the port P2, however, the signal will appear at the port P1 but will not appear at the port 3 due to the isolation between the ports 2 and 3. Also, when a signal applied to the port P3, it will appear at the port P1 but will not appear at the port P2. Furthermore, when signals are simultaneously applied to the ports P2 and P3, those signals will be combined so as to appear at the port P1 (when the coupler is used as a power combiner).

FIGS. 10 and 11 show examples of the hybrid coupler as 90° phase shifters by configuring their circuits so that when a signal is applied to the port P1, signals having phase difference of 90° with each other will appear at the ports P2 and P3, respectively. FIG. 10 is a circuit example of a capacitive coupling type hybrid coupler formed by the hybrid circuit HY with capacitors C1 to C6 and inductors L1 and L2, whereas FIG. 11 is a circuit example of an inductive hybrid coupler formed by the hybrid circuit HY with capacitors C11 to C14 and inductors L11 to L14.

In these examples of FIGS. 10 and 11, if the inductance values of the inductors L1, L2 and L11 to L14 are respectively expressed by the same references L1, L2 and L11 to L14 and the capacitance (static capacitance) values of the capacitors C1 to C6 and C11 to C14 by the same references C1 to C6 and C11 to C14, the inductance and capacitance values of the inductors and the capacitors are set as, L1=L2, C2=C5, C1=C3=C4=C6, L11=L12, L13=L14 and C11=C12=C13=C14.

FIG. 12 shows, as an example of practical mounting of the above-mentioned hybrid coupler on a wiring board, a capacitive coupling type hybrid coupler with a circuit configuration shown in FIG. 10. In this example, the inductors L1 and L2, the capacitors C1 to C6, and the resistor Re are provided as discrete parts and mounted on a printed wiring board Pt.

Meanwhile, in such the capacitive coupling type hybrid coupler with a circuit configuration shown in FIG. 12, when a signal is applied to the port P1 and signals shifted by 90° are derived from the ports P2 and P3, an error $\epsilon_p$ in the phase difference will depend on the following value $\Delta$.

If the inductance values of the inductors L1 and L2 are expressed by L1 and L2 and the capacitance values of the capacitors C1 to C6 by C1 to C6, the $\Delta$ is given as $\Delta=L1/L2$, $\Delta=C1/C3$, $\Delta=C2/C5$, $\Delta=C6/C4$. If $\Delta=1$, $\epsilon_p=0$, and if $\Delta>1$ or $\Delta<1$, $\epsilon_p=E$ (error exists).

On the other hand, in the inductive coupling type hybrid coupler with a circuit configuration shown in FIG. 11, the error $\epsilon_p$ of the phase difference in the signals obtained from the ports P2 and P3 will depend on the following value $\Delta$.

Also in this case, if the inductance values of the inductors L11 to L14 are expressed by L11 to L14 and the capacitance values of the capacitors C11 to C14 by C11 to C14, the $\Delta$ is given as $\Delta=L13/L14$, $\Delta=L11/L12$, $\Delta=C11/C12$, $\Delta=C13/C14$. If $\Delta=1$, $\epsilon_p=0$, and if $\Delta>1$ or $\Delta<1$, $\epsilon_p=E$ (error exists).

Therefore, if the hybrid coupler is formed by the hybrid circuit HY with discrete components as shown in FIG. 12, since there are variations among capacitances and inductances of the individual components, the value of $\Delta$ may sometimes deviate from $\Delta=1$ when the hybrid coupler is mass-produced. For this reason, it has been necessary to make adjustments by changing the components, for example.

With reference to FIGS. 13 to 16, description will be made of examples of the phase shift characteristics and the band pass characteristics (characteristics as a 90° phase shifter) of the inductive coupling type hybrid coupler and the capacitive coupling type hybrid coupler mentioned above.

In these FIGS. 13 to 16, the abscissa represents the frequency f (MHz), and in FIGS. 13 and 15, the ordinates represents the phase difference $\phi$, while in FIGS. 14 and 16, the ordinates represents the output ratio (dB).

Phase Shift Characteristics

If the above-mentioned hybrid coupler is used as a phase shifter (90° phase shifter), when a signal is applied to the port P1, signals having phase difference with each other are appeared at the ports P2 and P3, respectively.

FIGS. 13 and 15 show the phase shift characteristics of the inductive coupling type and the capacitive coupling type hybrid couplers used as 90° phase shifters, respectively, where the phase difference between signals from the ports P2 and P3 is denoted by $\phi$ and the frequency of the signals is denoted by f (MHz). In the figures, "FB" indicates a utilized frequency band (band width) where the condition of $90°-3°\leq\phi\leq 90°+3°$ is satisfied.

As is obvious from FIGS. 13 and 15, the frequency band (band width) "FB" of the inductive coupling type hybrid coupler (FIG. 13) is wider than that of the capacitive coupling type hybrid coupler (FIG. 15). Also, the variation in the phase shift characteristics of the inductive coupling type hybrid coupler (FIG. 13) is gentler than that of the capacitive coupling type hybrid coupler (FIG. 15).

As described above, in designing a hybrid coupler for a 90° phase shifter, the inductive coupling type can be designed to have a wider band width (FB) and is more advantageous for mass production than the capacitive coupling type.

Band Pass Characteristics

In FIGS. 14 and 16 showing the band pass characteristics or the hybrid couplers used as 90° phase shifters, N1 denotes the isolation characteristics between the ports P2 and P3 (values on the right-side axis of ordinates), N2 denotes the insertion loss characteristics from the port P1 to the port P3, and N3 denotes the insertion loss characteristics from the port P1 to the port P2.

With regard to the characteristics N1, the frequency band (band width) where the isolation between the ports P2 and P3 is 20 dB or more is designated as "FB1". With regard to the insertion loss characteristics N2 and N3, the frequency band (band width) corresponding to the insertion loss up to "3 dB+1 dB" is designated as "FB2".

As can be understood from FIGS. 14 and 16, there is little difference of the band width "FB1" in the isolation characteristics between the inductive coupling type hybrid coupler and the capacitive coupling type hybrid coupler. However, the band width "FB2" of the insertion loss characteristics of the inductive coupling type hybrid coupler is much wider than that of the capacitive coupling type hybrid coupler.

More specifically, when a hybrid coupler is designed as a 90° phase shifter, the inductive coupling type hybrid coupler can be designed to have a wider utilized frequency band width (FB2) in the pass band characteristics and is more advantageous for mass production than the capacitive coupling type hybrid coupler.

PROBLEMS OF THE PRIOR ART

However, the above-mentioned prior-art hybrid counters have the following problems.

(a) Generally, in the hybrid couplers, when signals having a phase difference with each other are provided to ports P2 and P3 by applying a signal to the port P1, the error $\epsilon_p$ of the phase difference depends on the value $\Delta$ which is a ratio between inductance values or a ratio between capacitance values (if $\Delta=1$, $\epsilon_p=0$).

Therefore, if there are variations in the values (inductance value, capacitance value) of the inductors and capacitors which constitute a hybrid circuit, the value $\Delta$ varies, resulting in a large error $\epsilon_p$ of the phase difference.

For example, as shown in FIG. 12, in case discrete inductors and capacitors are mounted on a wiring board to form a hybrid coupler, $\Delta=1$ may not always be obtained when the hybrid coupler is mass produced and thus each component will have deviation. As a result, the error $\epsilon_p$ of the phase difference between signals from the ports P2 and P3 becomes large.

(b) In case the hybrid coupler is designed as a 90° phase shifter, the phase shift changes of the inductive coupling type hybrid coupler will be gentler than that of the capacitive coupling type hybrid coupler, and the band width "FB" in the phase shift characteristics (band width of $90°-3°\leq\phi\leq 90°+3°$) of the former will be wider than that of the latter. The band width "FB2" in the insertion loss characteristics (the band width corresponding to an insertion loss of 3 dB+1 dB) of the inductive coupling type is wider than that of the capacitive coupling type. In other words, for a 90° phase shift, an inductive coupling type hybrid coupler will have wider band widths (FB, FB2) than a capacitive coupling type hybrid coupler and also will be adapted for mass production.

However, because the components are mostly constituted by inductors, the inductive coupling type hybrid coupler will have a high incidence of magnetic couplings between the inductors. For this reason, the hybrid coupler formed by an inductive coupling type hybrid circuit is not suitable for a small-sized SMD (Surface Mounting Device). In other words, in order to miniaturize the hybrid coupler for use as a small-sized SMD, it is necessary to arrange many inductors close to each other on the same wiring board. This causes many magnetic couplings between the inductors and thus it is difficult to obtain desired characteristics. Therefore, as mentioned above, the inductive coupling type hybrid coupler is not suitable for a small-sized SMD.

(c) In contrast, since the capacitive coupling type hybrid coupler does not have many inductors, it has a low incidence of the above-mentioned magnetic couplings between the inductors. In this respect, the capacitive coupling type is more suited For miniaturizing the hybrid coupler as a small-sized SMD.

However, when designed as a 90° phase shifter, the capacitive coupling type hybrid coupler exhibits a rapid change of the phase shift characteristics and has a narrower band width "FB" in the phase shift characteristics (band width of $90°-3°\leq\phi\leq 90°+3°$) than the inductive coupling type hybrid coupler. Furthermore, the band width "FB2" in the insertion loss characteristics (band width of 3 dB+ 1 dB) of the capacitive coupling type is narrower than that of the inductive coupling type. In other words, when designed as a 90° phase shifter, the capacitive coupling hybrid coupler cannot provide band widths (FB1, FB2) as wide as those of the inductive coupling type hybrid coupler. Therefore, the tolerance for deviation of the capacitance and inductance values during mass production was limited to a very small value, and thus the prior-art capacitive coupling type hybrid couplers were not suitable for mass production of small-sized hybrid couplers as SMDs.

SUMMARY OF THE INVENTION

It is therefore an object of the present invention is to improve the characteristics of the hybrid coupler by reducing deviation of the inductance and capacitance values in the components of the hybrid coupler. By this improvement, it will be possible to decrease the error $\epsilon_p$ of the phase difference of signals obtained at the ports on the output side when the hybrid coupler is designed as a phase shifter, for example.

Another object of the present invention is to realize an inductive coupling type hybrid coupler reduced in size used as a small-sized SMD by using an inductive coupling type hybrid circuit having wide band characteristics.

A further object of the present invention is to miniaturize the hybrid coupler as a small-sized SMD and to improve the hybrid coupler's aptitude for mass production.

According to the present invention, a hybrid coupler using a hybrid circuit has a plurality of circuit elements formed in a multi-layer wiring board, and a set of the circuit elements which is required to have the same capacitance or inductance value with each other is formed on common layers of the multi-layer wiring board.

The set of the circuit elements required to have the same inductance value with each other may be a plurality of inductors and/or capacitors.

Preferably, the hybrid coupler is formed by an inductor block arranged on dielectric layers and a capacitor block arranged on other dielectric layers of the multi-layer wiring board. The inductor block and the capacitor block are laminated to face each other, and a spacer layer is inserted between the inductor block and the capacitor block to increase the distance between the inductor block and the capacitor block.

It is preferred that the spacer layer is formed by a material with a dielectric constant ($\epsilon_2$) lower than a dielectric constant ($\epsilon_1$) of the dielectric layers of the capacitor block ($\epsilon_1 > \epsilon_2$).

Preferably, the thickness (TL) of each of the layers of the inductor block is thinner than the thickness (TO) of each of the remaining layers except for the layers of the capacitor block (TL<TO).

Furthermore, according to the present invention, a hybrid coupler of an inductive coupling type uses an inductive coupling type hybrid circuit. The hybrid circuit has four inductors connected in series in a ring shape to make four junction points. The inductors include two inductors with smaller inductance value and two inductors with larger inductance value. The hybrid circuit also has four capacitors connected between the junction points and the ground, respectively. Three of the junction points are used for ports (input/output terminals) and the remaining junction point is used for connecting a terminal resistor. The inductors and the capacitors are formed by conductor patterns in a multi layer wiring board. Particularly, the conductor patterns of the four inductors are formed on common insulation layers of the multi-layer wiring board. Furthermore, the inductors include two inductors with larger inductance values positioned side by side substantially in the middle position of the insulation layers. The inductors also include two inductors with smaller inductance values positioned on both sides of the inductors and substantially in the middle position between those inductors.

It is preferred that the conductor patterns of the four capacitors are formed side by side on common layers (dielectric layers) different from the layers on which the inductor patterns are formed.

According to the present invention, the following operations and advantages can be expected.

(a) Generally, in order to obtain two signals having phase difference with each other from two ports on the output side of the hybrid coupler by applying a signal to a port on the input side of the coupler, a set of specified circuit elements of the hybrid circuit should have the same inductance value or capacitance value. To this end, according to the present invention, conductor patterns of the set of circuit elements (inductors or capacitors) required to have the inductance or capacitance value is positioned on common layers of a multi-layer wiring board. Under this arrangement, a plurality of circuit elements whose patterns are positioned on the common layers in the wiring board can be manufactured under the same condition, so that the variations of the inductance or capacitance values can be extremely reduced. For example, if the multi-layer wiring board is a ceramic multi-layer wiring board, the contraction by baking of such the wiring boards and the conductor patterns takes place under the same condition. To be more specific, the value of $\Delta$ approaches very closely to $\Delta = 1$. As a result, the error of the phase difference between signals obtained from the output ports can be decreased.

(b) In designing the inductor block in the multi-layer circuit board, the inductors which are coupled magnetically with each other should be taken into account. Then, inductance values thereof are determined and arrangement (patterning) of the inductor patterns in the multi-layer wiring board is designed. In this case, the inductance values of the four inductors are set as two of them have larger value (Lb) and the remaining two have smaller value (La), and the arrangement is symmetrical to obtain symmetrical characteristics. More specifically, the inductors are arranged symmetrically in terms of their inductance values. To satisfy this relation, the inductors with larger inductance value are arranged side by side substantially in the middle position of the specified layer (insulation layer) of the multi-layer wiring board, and the inductors with smaller inductance value are arranged on both sides of the inductors with the larger value.

This arrangement is suitable for miniaturizing the hybrid coupler, and is advantageous in terms of coupling between the inductors. The inductors with larger inductance value may be coupled magnetically to some extent, but the inductors with smaller inductance values will be seldom coupled magnetically. Even though some magnetic coupling between the inductors occurs, since the above-mentioned symmetric arrangement is formed stably by such as printing, stable characteristics can be secured in mass production.

(c) As for the capacitors arranged in the capacitor block, since one side (hot side) electrode patterns of the capacitors are arranged symmetrically by patterning on one layer (dielectric layer), the capacitors can be formed stably in mass production.

BRIEF DESCRIPTION OF THE DRAWINGS

FIG. 12 is a diagram showing a concrete example of the prior-art hybrid coupler in which the elements are mounted;

FIG. 13 is a diagram showing the phase shift characteristics of the prior-art inductive coupling type hybrid coupler;

FIG. 14 is a diagram showing the band pass characteristics of the prior-art inductive coupling type hybrid coupler;

FIG. 15 is a diagram showing the phase shift characteristics of the prior-art capacitive coupling type hybrid coupler; and FIG. 16 is a diagram showing the band pass characteristics of the prior-art capacitive coupling type hybrid coupler.

BEST MODES FOR EMBODYING THE INVENTION

Embodiments of the present invention will be described in detail with reference to the accompanying drawings.

First Embodiment

According to the first embodiment of the present invention, a hybrid coupler is constituted by a plurality of circuit elements formed in a multi-layer wiring board. A set of the circuit elements which is required to have the same capacitance or inductance value with each other is formed on common layers of the multi-layer wiring board. Thus, difference of the capacitance or inductance value between the circuit elements can be reduced. As a result, the error of the phase difference, if the hybrid coupler is used as a phase shifter, can be reduced and the miniaturization of the hybrid coupler can be realized. Detailed description is given in the following.

Figure 1:
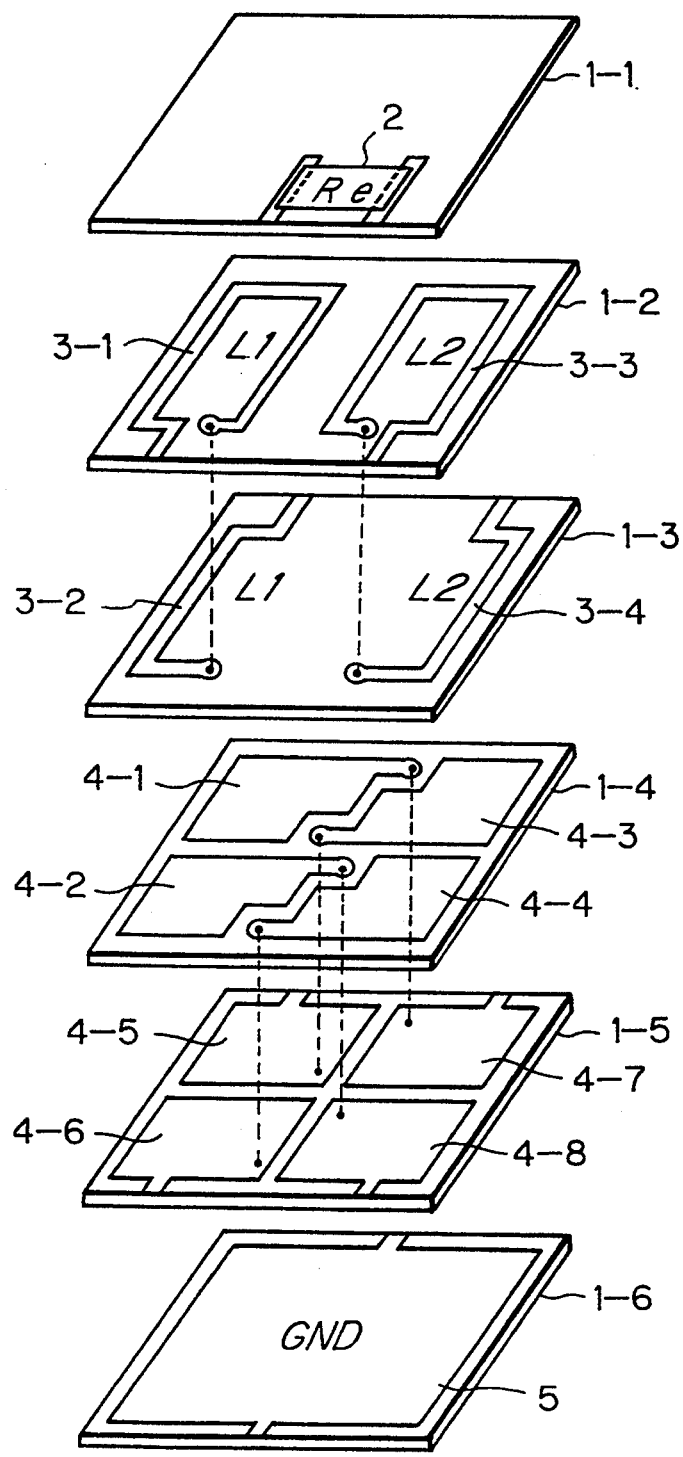
FIG. 1 is an exploded view in perspective of the hybrid coupler of a first embodiment according to the present invention.
Figure 2:
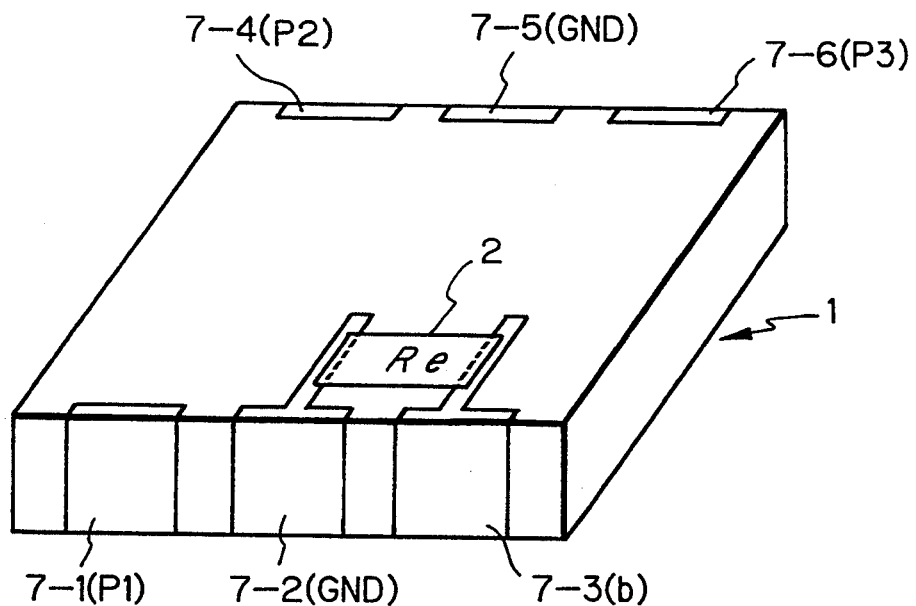
FIG. 2 is a perspective view of the hybrid coupler of the first embodiment.
Figure 3:
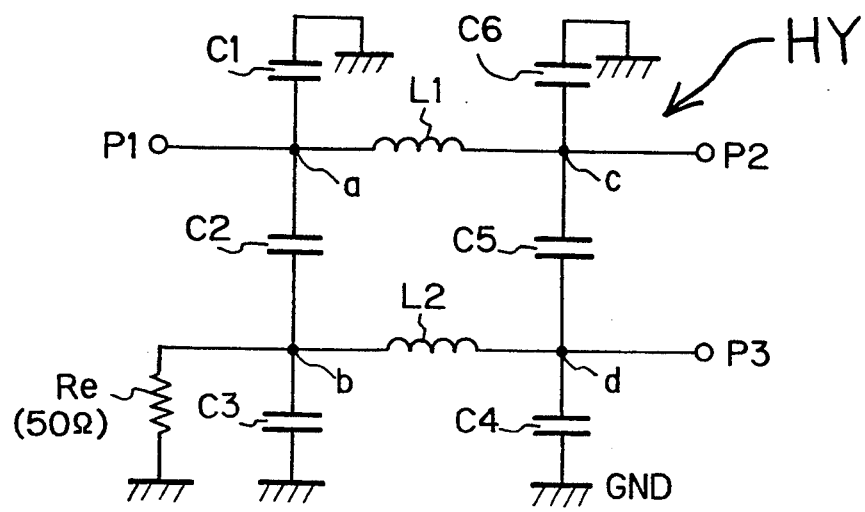
FIG. 3 is a circuit diagram of the capacitive coupling type hybrid circuit of the first embodiment.
Figure 4:
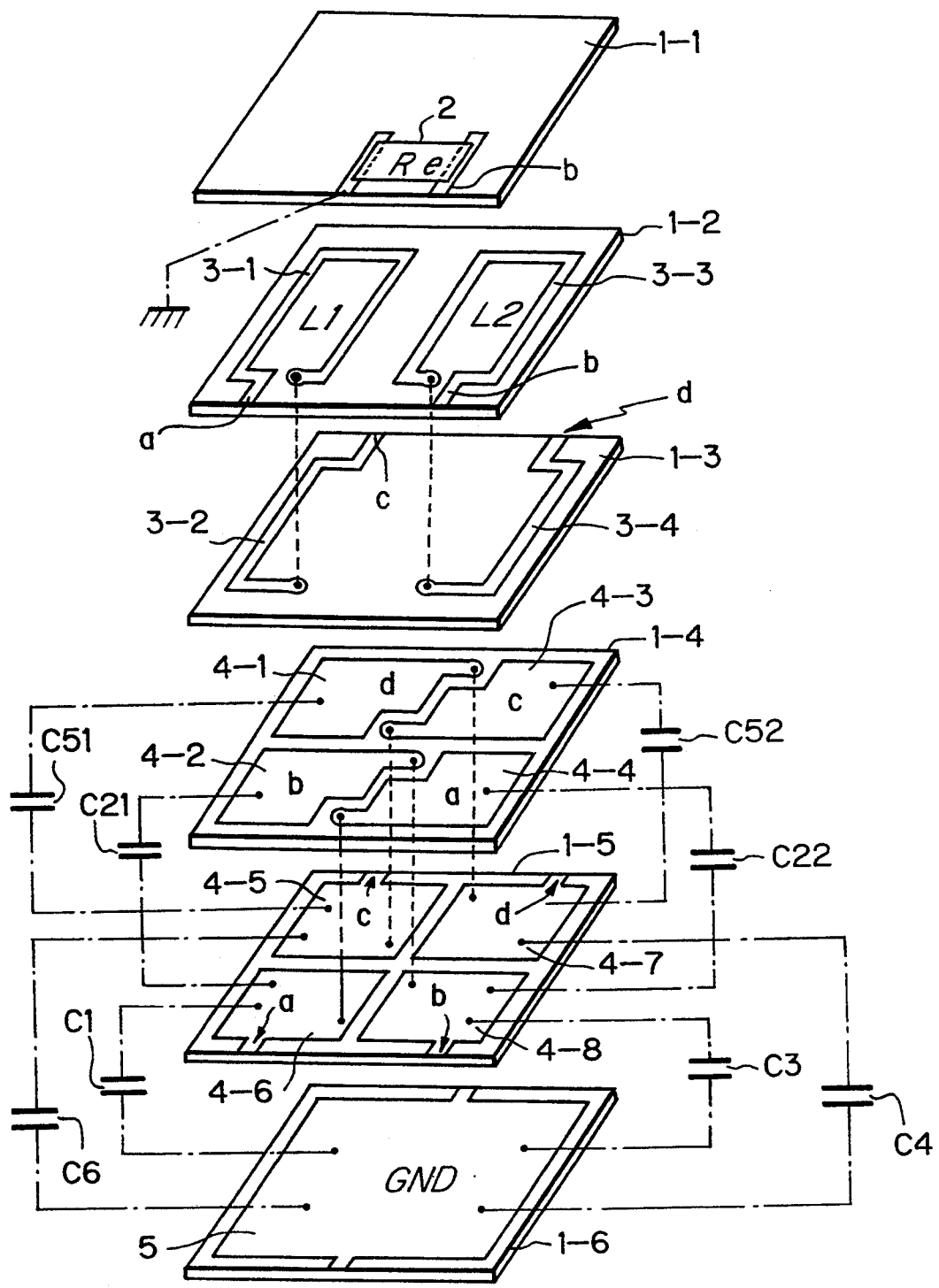
FIG. 4 is a diagram for explaining the hybrid coupler shown in FIG. 1.

FIG. 1 is an exploded view in perspective of the hybrid coupler of the first embodiment, FIG. 2 is a perspective view (of a completed product) of the hybrid coupler of the first embodiment, FIG. 3 is a circuit diagram of the hybrid coupler of the first embodiment, and FIG. 4 is a diagram for explaining the hybrid coupler shown in FIG. 1.

Figure 9:
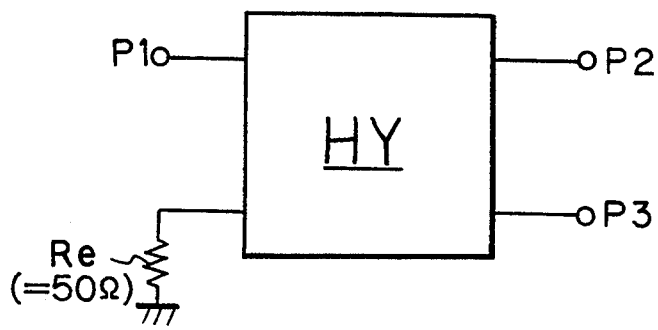
FIG. 9 is a block diagram of a typical hybrid coupler.
Figure 10:
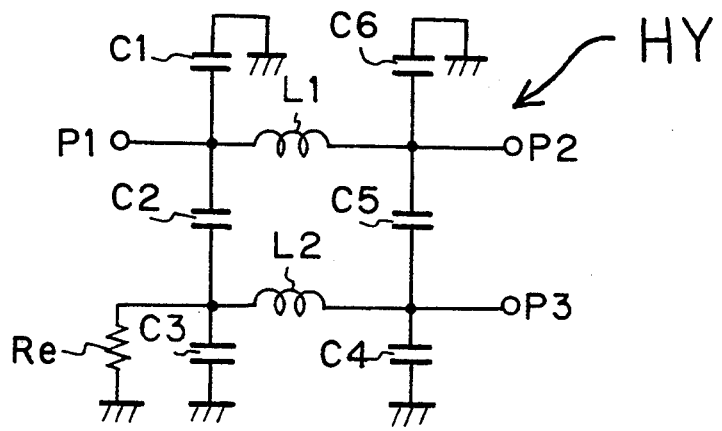
FIG. 10 is a diagram showing a circuit example of a typical capacitive coupling type hybrid coupler.
Figure 11:
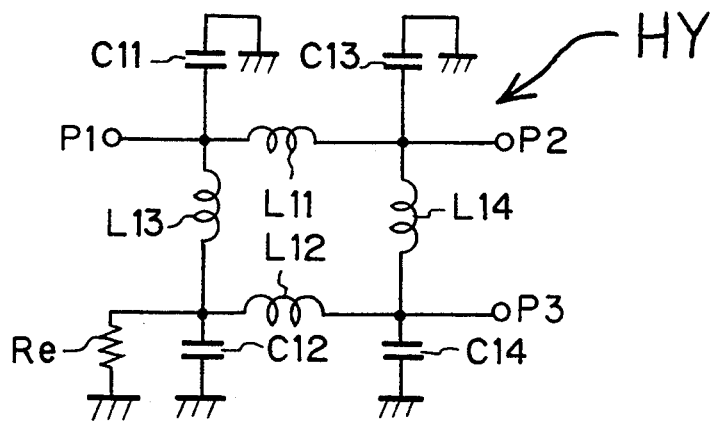
FIG. 11 is a diagram showing a circuit example of a typical inductive coupling type hybrid coupler.

In these figures, in which the same elements as those in FIGS. 9 to 11 are designated by the same reference numerals, reference numeral 1 denotes the multi-layer wiring board, 1-1 to 1-6 respectively denote first to sixth layers (dielectric layers) of the multi-layer wiring board 1, 3-1 to 3-4 denote inductor patterns, 4-1 to 4-8 denote capacitor electrode patterns, 5 denotes a GND electrode pattern, and 7-1 to 7-6 denote external terminals.

The hybrid coupler in this embodiment is a capacitive coupling type hybrid coupler made as an SMD (Surface Mounting Device) module using a multi-layer wiring board, and its circuit configuration is shown in FIG. 3. This hybrid coupler is composed of, by using a multi-layer wiring board (a ceramic multi-layer wiring board, for example), capacitors C1 to C6, inductors L1, L2, and a resistor Re as thick-film elements on the first layer 1-1 to the sixth layer 1-6 (dielectric layers). More specifically, a resistance pattern 2 is formed on the first layer 1-1, the inductor patterns 3-1 and 3-3 are formed on the same second layer 1-2, and the inductor patterns 3-2 and 3-4 are formed on the same third layer 1-3 of the multi-layer wiring board. The capacitor electrode patterns 4-1, 4-2, 4-3, and 4-4 are formed on the same fourth layer 1-4, the capacitor electrode patterns 4-5, 4-6, 4-7, and 4-8 are formed on the same fifth layer 1-5, and the GND electrode pattern (full surface pattern) 5 is formed on the fifth layer 1-5.

The above-mentioned resistor pattern 2, inductor patterns 3-1 to 3-4, capacitor patterns 4-1 to 4-8, GND electrode pattern 5 are formed independently with respect to each other, and parts of those elements which are to be connected to external terminals are exposed at the side faces of the multi-layer wiring board 1.

The resistance pattern 2 is formed by printing with a resistor paste, for example, whereas the inductor patterns 3-1 to 3-4, the capacitor electrode patterns 4-1 to 4-8, and the GND electrode pattern 5 are formed by printing with a conductor paste, for example.

The respective patterns formed on the first layer 1-1 to the sixth layer 1-6 are connected by via holes indicated by dotted lines, and the exposed parts of the patterns are connected to the external terminals 7-1 to 7-6 shown in FIG. 2, which are provided on the side faces of the multi-layer wiring board 1. The external terminal 7-1 is used as port P1, the terminal 7-4 as port P2, and the terminal 7-6 as port P3, and the terminals 7-2 and 7-5 as the GND electrodes. The terminal 7-3 corresponds to point b in FIG. 3. By providing the external terminals 7-1 to 7-6 on the side faces of the multi-layer wiring board 1, and connecting those terminals to the internal circuit, the hybrid coupler as an SMD module can be realized.

Referring to FIG. 4, relationship between the constitution of the hybrid coupler shown in FIGS. 1 and 2 and the circuit constitution shown in diagram of FIG. 3 will be described. In FIG. 4, the parts corresponding to points a to d in the circuit diagram of FIG. 3 and the parts at the same potential as those points are designated by a to d, respectively.

The resistance pattern 2 formed on the first layer 1-1 of the multi-layer wiring board 1 constitutes the resistor Re. One end of the resistance pattern 2 is connected through the external terminal 7-2 to the GND electrode pattern 5 on the sixth layer 1-6, and the other end is connected through the external terminal 7-3 to the capacitor electrode pattern 4-8 on the fifth layer 1-5, and this junction point is called point b.

The inductor pattern 3-1 on the second layer 1-2 and the inductor pattern 3-2 on the third layer 1-3 are connected together at the corresponding parts linked by the via hole shown in a dotted line, to form the inductor L1. The inductor pattern 3-3 on the second layer 1-2 and the inductor pattern 3-4 on the third layer 1-3 are connected together at the corresponding parts linked by the other via hole shown in the dotted line to form the inductor L2. The other end portions of the inductor patterns 3-1 to 3-4 are connected through the external terminals 7-1, 7-3, 7-4 and 7-6 to the capacitor electrode patterns 4-5 to 4-8, and the junction points are called points a to d.

The capacitor patterns 4-1 to 4-4 on the fourth layer 1-4 are connected by via holes as shown in the dotted lines to the capacitor patterns 4-5 to 4-8 on the fifth layer 1-5, respectively. Thus, the potential at the capacitor patterns 4-1 to 4-4 are the same as the potential at the points d to a, respectively. To be more specific, the patterns 4-4 and 4-6 are at the same potential as point a, the patterns 4-2 and 4-8 are at the same potential as point b, the patterns 4-3 and 4-5 are at the same potential as point c, and the patterns 4-1 and 4-7 are at the same potential as point d.

A capacitor C2 is constituted by a capacitor C21 formed between the capacitor electrode patterns 4-2 and 4-6 and a capacitor C22 formed between the capacitor electrode patterns 4-4 and 4-8 (C2=C21+C22), while a capacitor C5 is constituted by a capacitor C51 formed between the capacitor electrode patterns 4-1 and 4-5 and a capacitor C52 formed between the capacitor electrode patterns 4-3 and 4-7 (C5=C51+C52).

The GND side capacitor electrode is formed by the GND electrode pattern 5. The GND electrode pattern 5 on one side and the capacitor electrode patterns 4-5 to 4-8 on the other hand constitute capacitors C1, C3, C4 and C6. Namely, the capacitor C1 is formed between the capacitor electrode pattern 4-6 and the GND electrode pattern 5, and the capacitor C3 is formed between the capacitor electrode pattern 4-8 and the GND electrode pattern 5. Also, the capacitor C4 is formed between the capacitor electrode pattern 4-7 and the GND electrode pattern 5, and the capacitor C6 is formed between the capacitor electrode pattern 4-5 and the GND electrode pattern 5.

As described above, the inductors L1 and L2 are each formed by using the patterns on the second layer 1-2 and the third layer 1-3, the capacitors C2 and C5 are each formed by using the patterns on the fourth layer 1-4 and the fifth layer 1-5, and the capacitors C1, C3, C4, and C6 are each formed by using the patterns on the fifth layer 1-5 and the sixth layer 1-6. In other words, both the inductors L1 and L2 are formed by the respective patterns on the common layers 1-2 and 1-3 of the multi-layer wiring board, both the capacitors C2 and C5 are formed by the respective patterns on the common layers 1-4 and 1-5 of the multi-layer wiring board, and both the capacitors C1, C3, C4 and C6 are formed by the respective patterns on the common layers 1-5 and 1-6 of the multi-layer wiring board.

Since the inductors L1 and L2 are formed by the patterns on the layers which are common to these inductors, the capacitors C2 and C5 are formed by the patterns on the layers which are common to these capacitors, and the capacitors C1, C3, C4 and C6 are formed by the patterns on the layers which are common to these capacitors, contraction of the respective common layers by baking for example takes place under the same condition. Therefore, the difference of inductance and capacitance values between the circuit elements (between L1 and L2, between C2 and C5, and among C1, C3, C4 and C6) can be reduced to the minimum.

Consequently, it is possible to make the circuit elements infinitely approach the ideal condition that $\Delta = L1/L2 = 1$, $\Delta = C1/C3 = 1$, $\Delta = C2/C5 = 1$, $\Delta = C6/C4 = 1$, and $\epsilon_p = 0$ (where the error in the phase difference of signals at the ports P2 and P3 becomes zero).

Modifications of the first embodiment are possible as follows.

(a) An inductive coupling type hybrid coupler with a circuit configuration similar to that of FIG. 11 can be manufactured as an SMD module by using the multi-layer wiring board having the above-mentioned constitution. In this case, the inductors L13 and L14, the inductors L11 and L12, and the capacitors C11, C12, C13, and C14 are formed on the respective common layers of the multi-layer wiring board.

(b) The constitution of the first embodiment can be applied similarly to a hybrid coupler with a circuit configuration other than those shown in FIGS. 10 and 11.

(c) The multi-layer wiring board can be made of not only the ceramic material but also a resin (a glass-epoxy resin, for example).

(d) The multi-layer wiring board may be composed of any number of layers.

(e) A hybrid IC type coupler can be produced by mounting discrete components on the surface of the multi-layer wiring board.

The first embodiment described above offers the following advantages.

(A) A set of the circuit elements which is required to have the same capacitance or inductance value with each other is formed on the common layers of the multi-layer wiring board by using thick film patterns. Thus, difference of the capacitance or inductance value between the circuit elements can be reduced. More specifically, a plurality of the same kind circuit elements in the wiring board, which are required to have the same capacitance or inductance value, are manufactured under the same condition, so that the difference between the same kind elements can be reduced to a minimum. For example, when the multi-layer wiring board is a ceramic multi-layer wiring board, the contraction of the board and patterns by baking takes place under the same condition, and thus difference of the inductance or capacitance of the circuit elements formed on the same layers can be minimized ($\Delta$ becomes close to $\Delta = 1$). In consequence, when the hybrid coupler is used as a phase shifter, the error $\epsilon_p$ that arises in the phase difference of output signals can be reduced to the minimum.

(B) By using a multi-layer wiring board, the hybrid coupler can be miniaturized. Cost reduction can be achieved.

(C) A hybrid IC type hybrid coupler can be manufactured readily by mounting discrete components on the surfaces of the multi-layer wiring boards constituting the hybrid coupler.

Second Embodiment

According to the second embodiment of the present invention, a hybrid coupler is constituted by an inductive coupling type hybrid coupler having excellent phase shift and insertion loss characteristics as that shown in the first embodiment. Particularly, the hybrid coupler is a reduced-size SMD type hybrid coupler achieved by decreasing magnetic coupling between the inductors. Also, according to the second embodiment, the aptitude for mass production of the hybrid coupler has been improved. Detailed description is given in the following.

Figure 5:
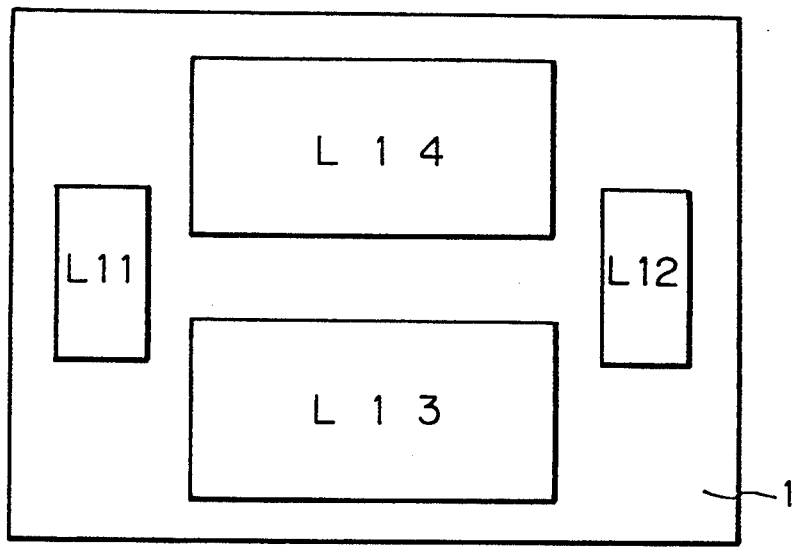
FIG. 5 is a diagram for explaining the arrangement of the inductors of a second embodiment according to the present invention.
Figure 6:
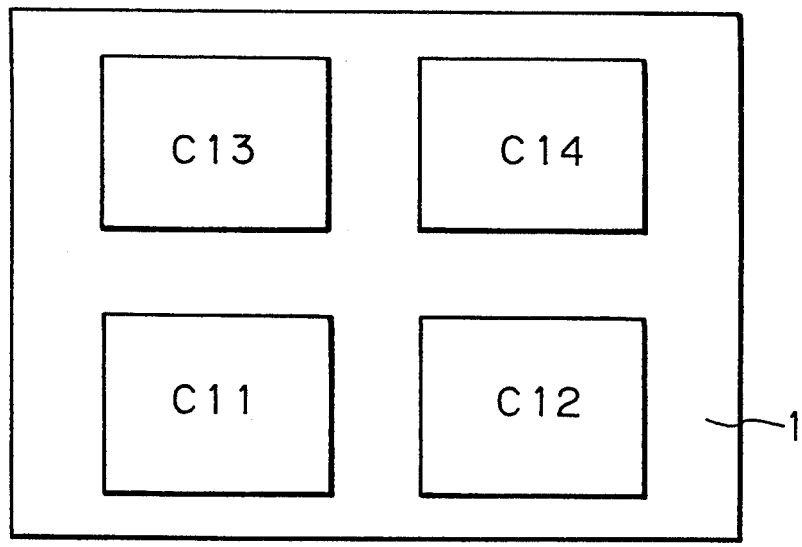
FIG. 6 is a diagram for explaining the arrangement of the capacitors of the second embodiment.
Figure 7:
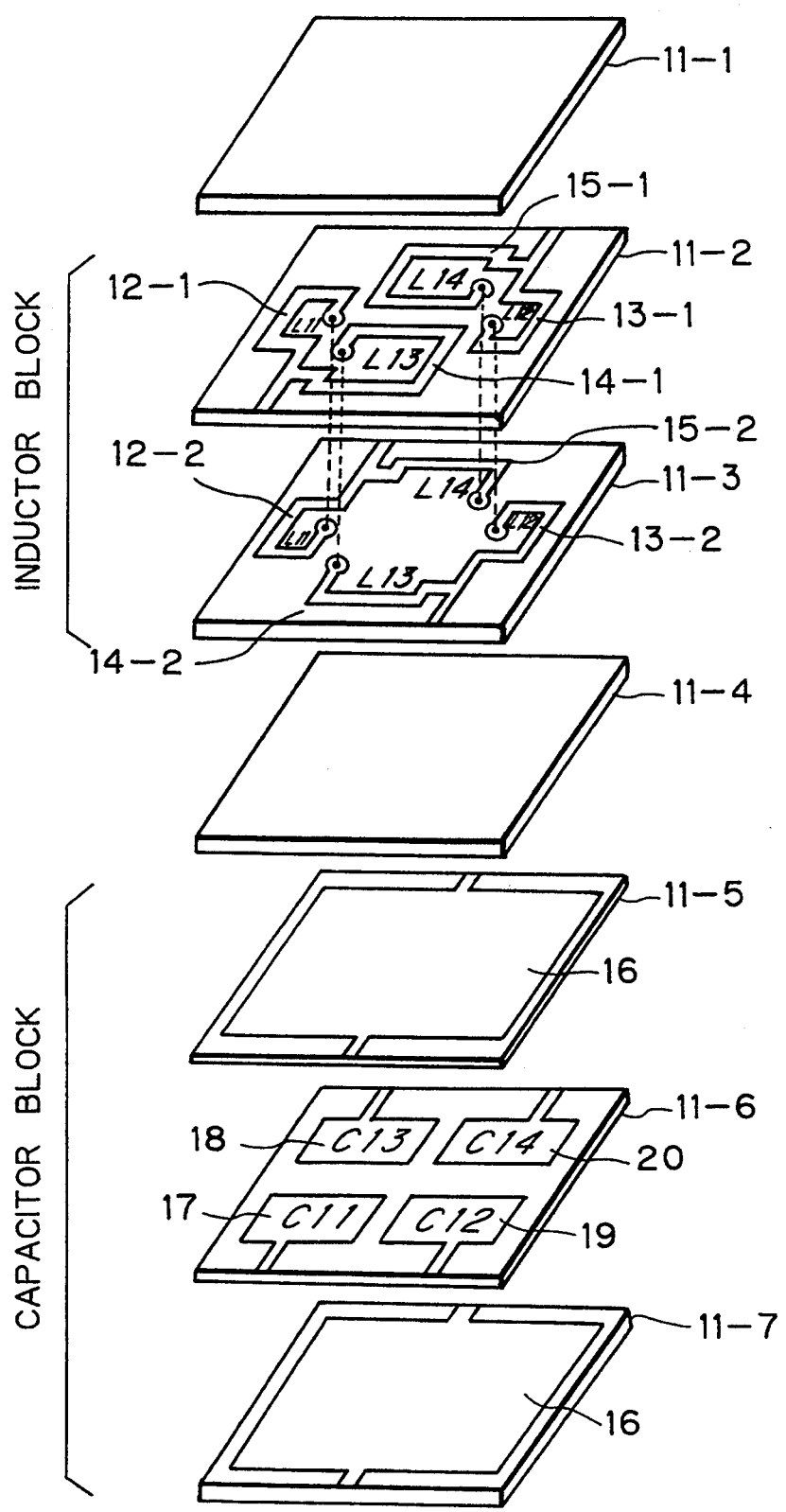
FIG. 7 is a exploded view in perspective of the hybrid coupler of the second embodiment.
Figure 8:
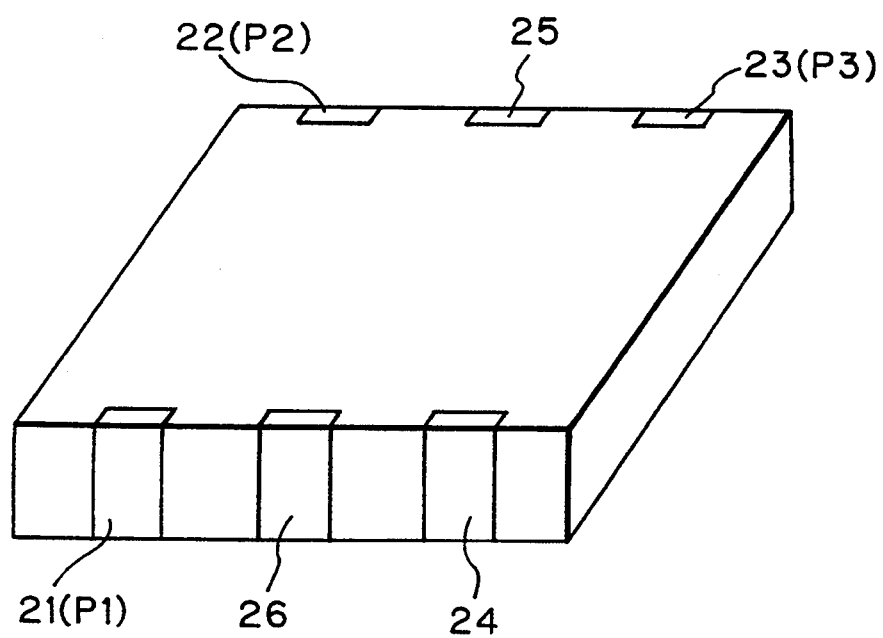
FIG. 8 is a perspective view of the hybrid coupler of the second embodiment.

FIG. 5 is a diagram for explaining the arrangement of the inductors in a second embodiment according to the present invention, FIG. 6 is a diagram for explaining the arrangement of the capacitors of the second embodiment, FIG. 7 is an exploded view in perspective of the hybrid coupler of the second embodiment, and FIG. 8 is a perspective view of the hybrid coupler of the second embodiment.

In these figures, in which the same elements as those in FIGS. 9 to 11 are designated by the same reference numerals, reference numeral 11-1 to 11-7 denote first to the seventh layers (dielectric layers) of the multi-layer wiring board 1, 12-1, 12-2, 13-1, 13-2, 14-1, 14-2, 15-1, and 15-2 denote inductor patterns. 16 denotes a GND electrode pattern, 17 to 20 denote capacitor electrode patterns, and 21 to 26 denote external electrodes (external terminals).

Since the circuit configuration of the inductive coupling type hybrid coupler used in this embodiment is the same as that of the hybrid coupler shown in FIG. 11, reference should be made to FIG. 11 during the following explanation.

In designing the hybrid coupler of this second embodiment, the inductors (L11, L12, L13 and L14 in FIG. 11) which are coupled magnetically with each other should be taken into account. Then, inductance values thereof are determined and arrangement (patterning) of the inductor patterns in the multi-layer wiring board is designed. In this case, the inductance values are set as $L11=L12=La$, $L13=L14=Lb$, and $La<Lb$. In other words, the inductance values and the arrangement of the inductors are to be symmetrically to obtain symmetrical characteristics as shown in FIG. 16, and relationship between La and Lb is to be $La<Lb$.

Concrete arrangement of the inductors is as follows. As shown in FIG. 5, the inductors L13 and L14 with larger inductance values are arranged side by side substantially in the middle position of the sheets (insulation layers) of the multi-layer wiring board, and the inductors L11 and L12 with smaller inductance values are arranged on both sides of the inductors L13 and L14. In order to reduce magnetic coupling with the inductors L13 and L14 to the minimum, the inductors L11 and L12 are arranged on both sides of the inductors L13 and L14 and in the middle position between the inductors L13 and L14. Namely, by this arrangement, the adjacent portions between the L11 and L12, and the L13 and L14 are minimized.

This arrangement of the inductors L13 and L14 where they are arranged side by side substantially in the middle position of the sheets (the insulation layers) is more suitable for the miniaturization of the hybrid coupler. As for the magnetic coupling between the inductors, in this arrangement, magnetic coupling occurs to some extent between the inductors L13 and L14, but magnetic coupling hardly occurs between the inductors between L11 and L12. Furthermore, magnetic coupling is minimized between the inductors L11 and L13, between the inductors L11 and L14, between the inductors L12 and L13, and between the inductors L12 and L14 because L11 and L12 are arranged on both sides of L13 and L14 and in the middle position between L13 and L14. What is most important is that the inductance values of the inductors are in the relation or $L11=L12$ and $L13=L14$, so that it is necessary to arrange the inductors in a point symmetry by pattern printing.

By the above arrangement, even though some magnetic coupling between the inductors occurs, since the above-mentioned symmetric arrangement is formed stably by such as printing, stable characteristics can be secured in mass production.

According to this embodiment, the capacitors which are provided in the multi-layer wiring board are set to have the capacitance value of $C11=C12=C13=C14$, as described above. For this purpose, the capacitors are arranged as shown in FIG. 6. Specifically, the one side electrode patterns of the four capacitors C11, C12, C13 and C14 are arranged symmetrically by patterning on one sheet (dielectric layer). The other side electrode patterns of the capacitors C11, C12, C13 and C14 are the common electrodes (GND electrode patterns 16). By this arrangement, the capacitors are formed stably.

In this embodiment, the electrode patterns of the inductors and the capacitors are formed on the sheets (dielectric layers or the like) forming the multi-layer wiring board by conductor patterns (by printing conductor paste). Namely, as shown in FIG. 7, the hybrid coupler is composed by forming the patterns on the dielectric layers of the first layer 11-1 to the seventh layer 11-7. The patterns of the inductors are formed on the second layer 11-2 and the third layer 11-3 of the multi-layer wiring board, while those of the capacitors are formed on the fifth layer 11-5, the sixth layer 11-6 and the seventh layer 11-7. How the respective patterns on the layers are formed is described in the following.

The first layer 11-1 is used as the protective layer without patterning. The second layer 11-2 and the third layer 11-3 (dielectric layers or insulation layers) are provided with the patterns of the inductors L11, L12, L13 and L14 arranged as shown in FIG. 5. More specifically, as illustrated, on the second layer 11-2, the inductor patterns 12-1, 13-1, 14-1 and 15-1 are formed by printing conductor paste, while on the third layer 11-3, the patterns of the inductors 12-2, 13-2, 14-2 and 15-2 are formed by printing conductor paste.

The inductor pattern on the second layer 11-2 and a predetermined portion of the inductor pattern of the third layer 11-3 are connected by via holes indicated by the dotted lines in FIG. 7 to form the above-mentioned inductors L11, L12, L13 and L14. Namely, the inductor patterns 12-1 and 12-2 constitute the inductor L11, the inductor patterns 13-1 and 13-2 constitute the inductor L12, the inductor patterns 14-1 and 14-2 constitute the inductor L18, and the inductor patterns 15-1 and 15-2 constitute the inductor L14.

The fourth layer 11-4 is a spacer layer which has no pattern formed thereon. This spacer layer is used to increase the distance between the inductor block and the capacitor block to thereby reduce the insertion loss of the hybrid coupler. This will be described in greater detail later on.

On the fifth layer 11-5, the GND electrode pattern 16 is formed in a full surface pattern by printing conductor paste. The GND electrode pattern 16 serves as the GND-side electrode for the capacitors.

On the sixth layer 11-6, the capacitor electrode patterns 17 to 20 (these are all hot-side electrodes, not the GND-side electrodes) of the capacitors C11, C12, C13 and C14 are formed in a symmetric arrangement with respect to the two center lines of the wiring board as shown in FIG. 6. Note that the capacitor electrode pattern 17 is the hot side electrode of the capacitor C11, the capacitor electrode pattern 18 is the hot side electrode of the capacitor C13, the capacitor electrode pattern 19 is the hot side electrode of the capacitor C13, and the capacitor electrode pattern 20 is the hot side electrode of the capacitor C14.

On the seventh layer 11-7, the GND electrode pattern 16 is formed in a full surface pattern by printing conductor paste. This GND electrode pattern 16 is also used the GND-side electrode of the capacitors.

As described above, since the GND electrode patterns 16 are formed at both the outsides of the capacitors, the effects from the outside to the capacitors can be reduced.

By laminating the above-mentioned respective layers (dielectric layers) together and by attaching external electrodes (external terminals), an SMD type hybrid coupler is completed. FIG. 8 shows the such completed hybrid module in a perspective view.

As shown in FIG. 8, the external electrodes (external terminals) 21 to 26 are formed at opposite end portions of the hybrid coupler. The external electrode 21 corresponds to the port P1, 22 to the port P2, 23 to the port P3, 24 to the electrode for connecting the terminal resistor Re, and 25 and 26 to the GND electrodes (external electrodes on the GND side).

The reasons why the spacer layer (fourth layer 11-4) is formed in the hybrid coupler is described as follows. The hybrid coupler is, as mentioned hereinbefore, formed by laminating the inductor block and the capacitor block so as to make those blocks face each other in the laminating direction of the multi-layer wiring board. If there is no spacer layer as shown in FIG. 1 (in the hybrid coupler of the first embodiment), the inductor block would be placed close to the capacitor block, and the lower-side inductor pattern of the inductor block would be placed face to face with and very close to the upper-side capacitor electrode pattern of the capacitor block. Thus, a stray capacitance will be produced between the conductor patterns of the inductor block and the capacitor block, so that the impedance of the inductors decreases.

The decrease in the inductor impedance can be compensated by enlarging the inductor pattern a little. In actuality, however, if the inductor pattern is enlarged, the inductor pattern become long (the conductor length is elongated), and the real resistance of the inductors will increase. As a result, Q of the inductors will decrease.

Therefore, in the second embodiment, as shown in FIG. 7, between the third layer 11-3 (the lower layer of the inductor block) and the fifth layer 1-5 (the upper-side layer of the capacitor block), there is provided the fourth layer 11-4 as the spacer layer to increase the space (distance) between the inductor block and the capacitor block more than the space of the first embodiment of FIG. 1. Consequently, the stray capacitance which occurs between the conductor patterns of the inductor block and the capacitor block can be decreased, so that the enhancement of the Q of the inductors can be realized. Moreover, a reduced-size, SMD type hybrid coupler can be realized.

The thickness of the spacer layer should be determined to be equal to or thicker than that of the layers on which inductor patterns are formed. To secure a required thickness, it is possible to laminate a plurality of dielectric sheets together to form a spacer layer. However, if the fourth layer 11-4 as the spacer layer has too large thickness, it may be difficult to perform the binder removal process and to control the baking process. Therefore, the spacer thickness should be determined to a value i accordance with the whole shape of the coupler. For example, the spacer layer thickness may be determined so that the whole thickness of the hybrid coupler is within 2 mm.

It is advantageous that only the fourth layer 11-4 as the spacer layer is formed by a material with a lower dielectric constant $\epsilon_2$ than the dielectric constant $\epsilon_1$ of the fifth layer 11-5 and the sixth layer 11-6 ($\epsilon_1 > \epsilon_2$). By so doing, the stray capacitance between the inductor block and the capacitor block can be extremely reduced. In this embodiment, the layers other than the spacer layer 11-4 are made of a material with the same dielectric constant $\epsilon_1$ to facilitate manufacturing.

Modifications of the second embodiment are possible as follows.

(a) If larger capacitance value of the capacitor block is required, the number of layers can be increased more than that shown in FIG. 7 (by increasing the dielectric layers). In this case, all hot side capacitor electrodes of the four capacitors are patterned oil the same layer.

(b) The inductor block may be constituted by a larger number of layers. In this case, it is necessary to use the similar arrangement of the inductors as that of the above-mentioned embodiment.

(c) The terminal resistor Re may be connected to the external electrode 24 of the hybrid coupler, or may be mounted on the multi-layer wiring board as a discrete component.

The second embodiment described above offers the following advantages.

(A) When a hybrid coupler is designed as a 90° phase shifter for example, changes in the phase shift characteristics of the inductive coupling hybrid coupler are gentler, and the band width "FB" in the phase shift characteristics (band width of $90° - 3° \leq \phi \leq 90° + 3°$) is longer than those of the capacitive coupling type hybrid coupler. In addition, the band width in the insertion loss characteristics (the band width "FB2" corresponding to the insertion loss up to 3 dB+1 dB) is longer than that of the capacitive coupling type hybrid coupler. In other words, when the hybrid coupler is designed as a 90° phase shifter, the inductive coupling type hybrid coupler can be designed to have wider band widths (FB, FB2) and is advantageous for mass production in comparison with the capacitive coupling type hybrid coupler.

(B) The inductive coupling type hybrid circuit has wide band characteristics, and therefore, even if variations occur in the inductance value during production, this does not much affect the characteristics of the completed hybrid coupler. As a result, the inductive coupling type hybrid circuit is best adapted for mass production.

(C) In each of the inductor block and the capacitor block, four elements are patterned on the common layers. Therefore, even though variations of capacitance and inductance values of the elements occur during production, these variations will be evenly appeared over all elements. Thus, the resulting variations in the characteristics of the hybrid couplers will be limited to the minimum causing the inductive coupling type hybrid coupler to be easily mass-produced.

(D) Since the GND electrode patterns 16 are formed at both the outsides of the capacitors, the effects from the outside to the capacitors can be reduced.

(E) Even if magnetic coupling occurs between the inductors, since the symmetric arrangement of the inductors is made stably by printing, stable characteristics can be secured in mass production.

(F) By the spacer layer provided between the inductor block and the capacitor block, the stray capacitance between them can be reduced. Consequently, a high Q can be secured for the inductors.

(G) If the spacer layer is formed by a material with a low dielectric constant, the stray capacitance between the inductor block and the capacitor block can be reduced more than that induced by the embodiment of FIG. 1. This further enhances the Q of the inductors.

Third Embodiment

A third embodiment of the present invention will be described with reference to FIG. 7. This third embodiment is a modification of the second embodiment, in which the thickness of the layer of the inductor block is further thinned to secure a higher Q for the inductors, and as a result, a thin hybrid coupler can be created.

If a hybrid coupler is designed for a band of 50 MHz to 300 MHz, for example, the inductance value of the inductors will be about several tens of nH to 200 nH. However, a ferrite material cannot be used for such the frequency band. For a frequency band at which the ferrite material cannot be used, coreless inductors will be used. In order to realize an inductance of about 100 nH, it is necessary that each of the coreless inductors has several turns of coil. However, in order to miniaturize the hybrid module, it is required to increase the number of turns of the coils. This will cause the number of layers to increase and thus the module will become thicker.

The third embodiment can improve the above-mentioned problems. Namely, the thickness of the SMD module type hybrid coupler can be further reduced, and a higher Q can be secured for the inductors. Detailed description is given below.

In FIG. 7, the thickness of the second layer 11-2 of the inductor block is made thinner than the thickness of each of the remaining layers (the first layer 11-1, the third layer 11-3, the fourth layer 11-4, and the seventh layer 11-7) except for the fifth layer 11-5 and the sixth layer 11-6 of the capacitor block. For example, if the thickness of the second layer 11-2 is denoted by TL, the thickness of each of the first layer 11-1, the third layer 11-3, the fourth layer 11-4, and the seventh layer 11-7 is denoted by TO (the thickness of each of those layers is the same), and the thickness of each of the fifth layer 11-5 and the sixth layer 11-6 is denoted by TC, the relation between TL and TO is TL<TO. The thickness TC of the sixth layer 11-6 is normally set to be smaller than the thickness TO, but the thickness relationship between TC and TL may be selected arbitrarily. The respective thicknesses TO, TL, and TC are TO=160 $\mu$m, TL=80 $\mu$m, and TC=40 $\mu$m, for example. The thickness TL of the layer in the inductor block varies with the determined inductance value of the inductors, but is set to be about 25% to 75% of the thickness TO. If the inductance value of the inductors is larger, it is effective that the thickness TL is thinner.

This third embodiment provides the following effects in addition to the effects according to the second embodiment.

Since the thickness TL of the second layer 11-2 of the inductor block is in the condition of TL<TO, the number of turns of the inductor at unit length (the thickness of the layer, in this case) becomes larger than in the case of TL=TO as well as in case of a solenoid, causing the inductance value to become larger. Furthermore, since the conductor length (inductor pattern length) remains unchanged, the conductor loss does not change. Therefore, a higher Q of the inductors can be obtained.

As a result, high inductance value of about 100 nH can be set in the small-sized module. In addition, as the inductor layer is reduced in thickness, the thickness of the whole module can be decreased, accordingly. In consequence, the binder removal process and the baking process during manufacturing can be further facilitated.

INDUSTRIAL APPLICABILITY

The present invention can be applied to the wireless equipment such as the cordless phone, portable phone or the like, and to other kinds of communication equipment.

We claim:

1. A hybrid coupler including a hybrid circuit, comprising:
    a multilayer wiring board having at least first, second, third and fourth dielectric layers laminated to each other;
    a plurality of inductors comprising conductor patterns formed on said first and second dielectric layers, at least two of said inductors having the same inductance value as each other; and
    a plurality of capacitors comprising conductor patterns formed on said third and fourth dielectric layers, at least two of said capacitors having the same capacitance value as each other,
    wherein said conductor patterns, corresponding to said inductors with the same inductance value, comprise first symmetrically shaped conductor patterns formed on said first dielectric layer and second symmetrically shaped conductor patterns formed on said second dielectric layer, and wherein said conductor patterns, corresponding to said capacitors with the same capacitance value, comprise third symmetrically shaped conductor patterns formed on said third dielectric layer and fourth symmetrically shaped conductor patterns formed on said fourth dielectric layer.

2. The hybrid coupler as claimed in claim 1, wherein said multilayer wiring board has a spacer layer inserted between said second and third dielectric layers.

3. The hybrid coupler as claimed in claim 2, wherein said spacer layer is made of a dielectric material with a dielectric constant lower than a dielectric constant of said third and fourth dielectric layers.

4. The hybrid coupler as claimed in claim 1, wherein said multilayer wiring board includes a top layer and a bottom layer, and wherein a thickness of each of said first and second dielectric layers is less than a thickness of said top and bottom layer.

5. The hybrid coupler as claimed in claim 1, wherein said multilayer wiring board includes a top layer, a bottom layer, and a ground conductor pattern formed on said bottom layer.

6. The hybrid coupler as claimed in claim 1, wherein said hybrid circuit is
    an inductive coupling-type hybrid circuit including:
    (i) a ground, four junction points and four of said inductors; each inductor being connected between two of said junction points in series with the other inductors to form a loop; a first pair of said inductors having a first inductance value and a second pair of said inductors having a second inductance value greater than said first inductance value;
    (ii) said plurality of capacitors having the same capacitance connecting said junction points to ground;
    (iii) a terminal resistor connected to one of said junction points with the other three junction points defining input/output ports; and
    (iv) said second pair of inductors being positioned side-by-side substantially in the center of said first and second dielectric layers; each inductor of said first pair being substantially centrally positioned on a side of said second pair of inductors; said capacitors being positioned side-by-side each other on said third and fourth dielectric layers.

7. The hybrid coupler as claimed in claim 6, wherein said multilayer wiring board has a spacer layer inserted between said second and third dielectric layers.

8. The hybrid coupler as claimed in claim 7, wherein said spacer layer is made of a dielectric material with a dielectric constant lower than a dielectric constant of said third and fourth dielectric layers.

9. The hybrid coupler as claimed in claim 6, wherein said multilayer wiring board further has a top layer and a bottom layer, and wherein a thickness of each of said first and second dielectric layers is less than a thickness of said top and bottom layer.

10. The hybrid coupler as claimed in claim 6, wherein said multilayer wiring board includes a top layer, a bottom layer, and a ground conductor pattern formed on said bottom layer.

11. An inductive coupling-type hybrid coupler comprising:
   an inductive coupling-type hybrid circuit including:
   (i) a ground, four junction points and four inductors: each inductor being connected between two of said junction points in series with the other inductors to form a loop; a first pair of said inductors having a first inductance value and a second pair of said inductors having a second inductance value greater than said first inductance value;
   (ii) four capacitors, each capacitor being connected between one of said junction points and ground;
   (iii) a terminal resistor connected to one of said junction points with the other three junction points defining input/output ports; and
   (iv) a multilayer wiring board including insulation layers and dielectric layers, having conductor patterns thereon forming said inductors and capacitors; the four inductor conductor patterns being formed on common insulation layers; said second pair of inductors being positioned side-by-side substantially in the center of said common insulation layers; each inductor of said first pair being substantially centrally positioned on a side of said second pair of inductors; the four capacitor conductor patterns being positioned side-by-side each other on common dielectric layers.

* * * * *